United States Patent
Min

(10) Patent No.: US 7,265,621 B1
(45) Date of Patent: Sep. 4, 2007

(54) FULLY DIFFERENTIAL OPERATIONAL AMPLIFIER WITH FAST SETTLING TIME

(75) Inventor: Byung-Moo Min, Lexington, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 132 days.

(21) Appl. No.: 11/181,564

(22) Filed: Jul. 13, 2005

(51) Int. Cl.
*H03F 3/45* (2006.01)

(52) U.S. Cl. .................................. 330/253; 330/258

(58) Field of Classification Search ............ 330/252, 330/253, 258, 261; 327/359, 563
See application file for complete search history.

(56) References Cited

U.S. PATENT DOCUMENTS 5,847,607 A 12/1998 Lewicki et al.
6,759,898 B1 * 7/2004 Opris ...................... 330/253

* cited by examiner

*Primary Examiner*—Khanh Van Nguyen
(74) *Attorney, Agent, or Firm*—Patent Law Group LLP; Carmen C. Cook

(57) ABSTRACT

An operational amplifier includes a pair of differential input transistors, a pair of cascode transistors and a keep-alive circuit. The pair of differential input transistors is connected together at the source terminals and the gate terminals of the input transistors receive a pair of differential input signals. Each cascode transistor is connected to a respective input transistor to form a cascode. The drain terminals of the pair of cascode transistors provide a pair of differential output signals. The keep-alive circuit is connected to provide first and second bias currents to the source terminals of the pair of cascode transistors. In operation, each of the first and second bias currents is a variable current being a function of a voltage at the source terminal of the respective cascode transistor. The first and second bias currents keep the pair of cascode transistors alive during transient overload conditions.

13 Claims, 3 Drawing Sheets

FULLY DIFFERENTIAL OPERATIONAL AMPLIFIER WITH FAST SETTLING TIME

FIELD OF THE INVENTION

The invention relates to high speed fully differential operational amplifiers and, in particular, to a high speed fully differential operation amplifier with fast settling time during transient overload.

DESCRIPTION OF THE RELATED ART

Settling time is the amount of time, following application of a step input, that is required for the output voltage to settle to within a specified percentage of its desired final value. For example, the settling time is a measure of the time period for which an operational amplifier does not provide an accurate output, following a rapid signal change. In practice, settling time is commonly specified as the time required for a response to settle to within 0.1 or 0.01 percent of final value. Alternatively, settling time can be expressed as the time required to settle to within $2^{-x}$ error range from the final value. Using this notation, settling time is commonly said to settle to X bits within a specified number of seconds.

In order to achieve short settling times, folded cascode operational amplifiers have been used extensively. U.S. Pat. No. 5,847,607 to Lewicki et al. (issued Dec. 8, 1998) describes an operational amplifier that has its input stage transistors in an active cascode configuration to improve the gain, reduce the Miller feedback gate-to-drain capacitance, and reduce settling time. The '607 patent includes a biasing circuit to keep the cascode transistors biased during transient overload so that settling time will not be adversely affected during the recovery of the cascodes.

FIG. 1, which duplicates substantially FIG. 12 of the '607 patent, is a circuit diagram of a prior art all CMOS folded cascode operational amplifier. The operational amplifier of the FIG. 1 provides high gain and wide band-width using an active cascode technique applied to the input stage transistors and a cascode biasing technique. Referring to FIG. 1, transistors M5 and M6 form the differential pair input stage of the operational amplifier where the gate terminals of the transistors are the differential pair input terminals. The source terminals of transistors M5 and M6 are connected together and to the drain terminal of a tail current transistor M7. The gate terminal of tail current transistor M7 is biased by a bias voltage Vcmfb. The output currents at the drain terminals of input stage transistors M5 and M6 are folded up through folded cascode transistors M8 and M9. Transistors M1 and M2 are two "keep-alive" transistors which operate to feed forward a small fraction of the tail current to "keep-alive" or bias the folded cascode transistors M8 and M9 with enough current so that transistors M8 and M9 will not turn off during transient slewing. Thus, the settling time will not be adversely affected during the recovery of the cascodes in response to a transient overload event. In the '607 patent, the gate terminals of keep-live transistors M1 and M2 are biased by the same bias voltage Vcmfb as tail current transistor M7.

As thus configured, the keep-alive transistors M1 and M2 feed forward a small fraction of the tail current to the source terminals (nodes A and B) of cascode transistors M8 and M9 to keep the cascode transistors turned on or "alive" during transient overload. In the circuit configuration of FIG. 1, because keep-alive transistors M1 and M2 are biased by the same gate voltage Vcmfb as the tail current transistor M7, a fixed or a preselected fraction of the tail current is applied to the source of the cascode transistors. A shortcoming of the circuit configuration of FIG. 1 is that transistors M1 and M2 can flow only a "fixed" amount of current during the transient overload, as determined by the gate voltage Vcmfb being applied. The reduction of settling time in the operation amplifier of FIG. 1 is thus limited because of the "fixed" current being used in the keep-alive transistors.

SUMMARY OF THE INVENTION

According to one embodiment of the present invention, an operational amplifier includes a pair of differential input transistors where each transistor has a source terminal, a gate terminal and a drain terminal, a pair of cascode transistors where each cascode transistor has a source terminal, a gate terminal and a drain terminal, and a keep-alive circuit. The pair of differential input transistors is connected together at the source terminals and the gate terminals of the pair of differential input transistors receive a pair of differential input signals. Each cascode transistor of the pair of cascode transistors is connected to the respective input transistor so as to form a cascode. The drain terminals of the pair of cascode transistors provide a pair of differential output signals. The keep-alive circuit is connected to provide first and second bias currents to the source terminals of the pair of cascode transistors. In operation, each of the first and second bias currents is a variable current being a function of a voltage at the source terminal of the respective cascode transistor.

In one embodiment, the keep-alive circuit includes a tail current transistor and a pair of keep-alive transistors. The tail current transistor has a source terminal connected to a ground potential, a drain terminal connected to the source terminals of the pair of differential input transistors, and a gate terminal receiving a first bias voltage. The tail current transistor conducts a third bias current. The pair of keep-alive transistors includes first and second keep-alive transistors. The first keep-alive transistor has a source terminal connected to the ground potential, a gate terminal and a drain terminal connected together and to the source terminal of a first cascode transistor of the pair of cascode transistors to provide the first bias current. The second keep-alive transistor has a source terminal connected to the ground potential, a gate terminal and a drain terminal connected together and to the source terminal of a second cascode transistor of the pair of cascode transistors to provide the second bias current.

Accordingly to another aspect of the present invention, an operational amplifier includes a first input transistor having a source terminal, a gate terminal and a drain terminal where the gate terminal receives a first input signal of a pair of differential input signals; a second input transistor having a source terminal, a gate terminal and a drain terminal where the source terminal of the second input transistor is connected to the source terminal of the first input transistor and the gate terminal receives a second input signal of the pair of differential input signals; a first cascode transistor having a source terminal, a gate terminal and a drain terminal where the source terminal is connected to the drain terminal of the first input transistor and the drain terminal provides a first output signal of a pair of differential output signals; a second cascode transistor having a source terminal, a gate terminal and a drain terminal where the source terminal is connected to the drain terminal of the second input transistor and the drain terminal provides a second output signal of the pair of differential output signals; a tail current transistor having a drain terminal connected to the source terminals of the first and second input transistors, a source terminal connected to a ground potential and a gate terminal coupled to a first bias voltage where the tail current transistor conducts a first bias current; a first keep-alive transistor having a source terminal being connected to the ground potential, a gate terminal and a drain terminal connected together and to the source terminal of the first cascode transistor where the first keep-alive transistor conducts a second bias current; and a second keep-alive transistor having a source terminal being connected to the ground potential, a gate terminal and a drain terminal connected together and to the source terminal of the second cascode transistor where the second keep-alive transistor conducts a third bias current. In operation, the second bias current is a function of a voltage at the source terminal of the first cascode transistor and the third bias current is a function of a voltage at the source terminal of the second cascode transistor. The second bias current and the third bias current each has a variable fraction of the first bias current conducted by the tail current transistor.

The present invention is better understood upon consideration of the detailed description below and the accompanying drawings.

DETAILED DESCRIPTION OF THE PREFERRED EMBODIMENTS

In accordance with the principles of the present invention, a high speed fully differential operational amplifier with fast settling time uses an active cascode technique applied to the operational amplifier's input stage transistors and a cascode biasing scheme whereby a pair of keep-alive transistors operate to feed forward a variable fraction of the tail current to keep the cascode transistors turned on during transient overload. The active cascode technique is applied to the input stage transistors to improve the gain, provide a higher output impedance, and thus reduce the Miller feedback gate-to-drain capacitance of the input stage devices. The cascode biasing scheme keeps the cascode transistors biased or alive during transient overload so that settling will not be adversely affected during the recovery of the cascodes. In this manner, a high speed operational amplifier with fast settling time is realized.

Figure 2:
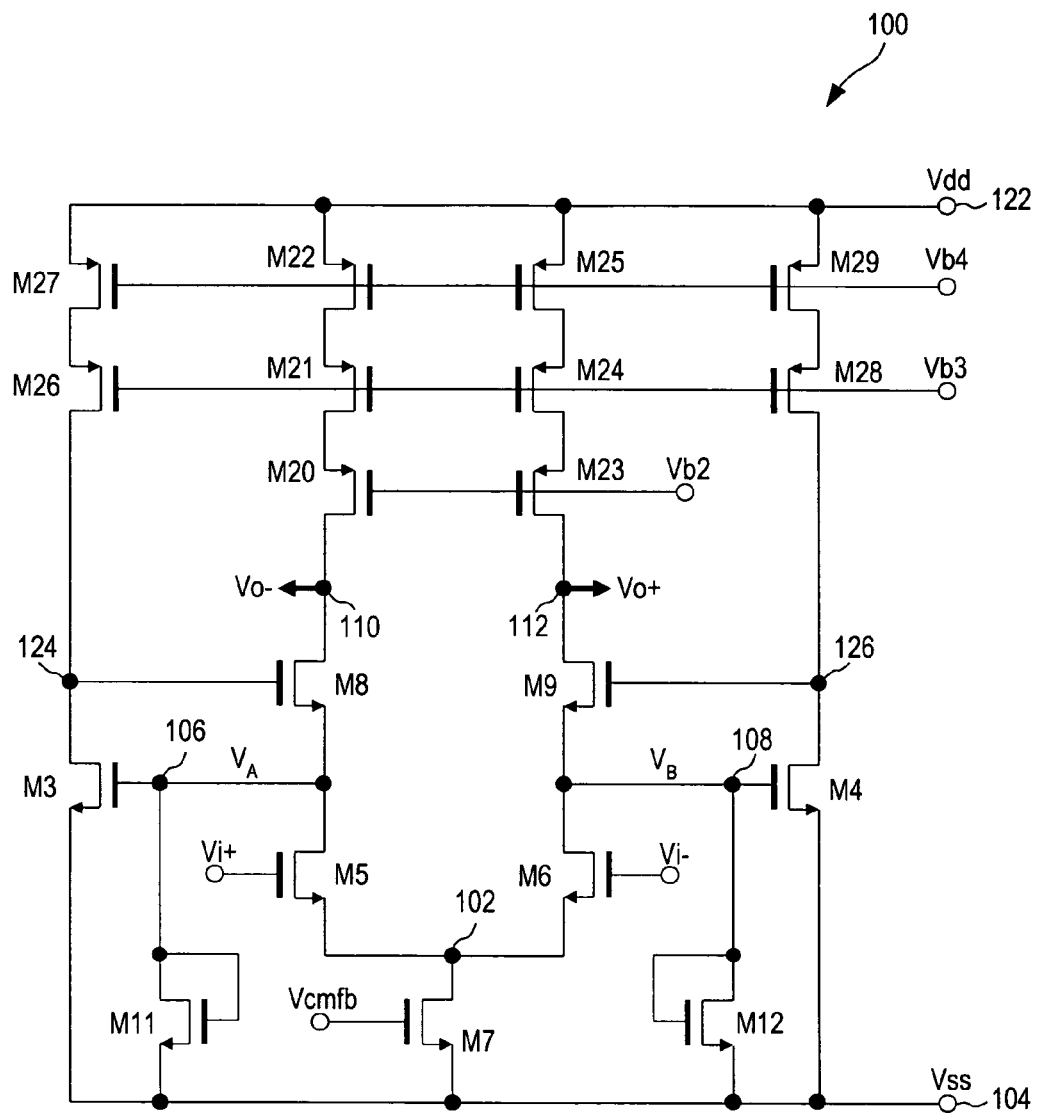
FIG. 2 is a circuit diagram of a fully differential operation amplifier according to one embodiment of the present invention.

FIG. 2 is a circuit diagram of a fully differential operation amplifier according to one embodiment of the present invention. Referring to FIG. 2, operational amplifier 100 includes transistors M5 and M6 forming the differential pair input stage. The input signals VI+ and VI− are coupled to the gate terminals of transistors M5 and M6. The source terminals (node 102) of transistors M5 and M6 are connected together and to the drain terminal of a tail current transistor M7. Tail current transistor M7 has a source terminal coupled to the ground potential (node 104) and a gate terminal biased by a common mode feedback voltage Vcmfb. Tail current transistor M7, as biased by voltage Vcmfb, provides the necessary amount of tail current to allow the amplifier to function properly. The generation of the common mode feedback voltage Vcmfb is known in the art and is fully described in the aforementioned U.S. Pat. No. 5,847,607.

Operational amplifier 100 further includes folded cascode transistors M8 and M9 coupled to the drain terminals of input transistors M5 and M6 respectively. The output currents at the drain terminals of input stage transistors M5 and M6 are folded up through folded cascode transistors M8 and M9. The drain terminals of cascode transistors M8 and M9 form the negative and positive output terminals 110 and 112, respectively, of operational amplifier. The output signal Vo− is provided at the negative output terminal 110 while the output signal Vo+ is provided at the positive output terminal 112.

In order to achieve very fast settling time, operational amplifier 100 includes two diode-connected transistors M11 and M12 coupled to supply a certain amount of current to cascode transistors M8 and M9 to keep transistors M8 and M9 turned on ("alive") during transient overload conditions. Therefore, transistors M11 and M12 are also referred to as "keep-alive" transistors. Specifically, keep-alive transistor M11 has a drain terminal coupled to the source terminal (node 106) of cascode transistor M8 and a source terminal coupled to the ground potential (node 104). The gate terminal of transistor M11 is connected to its own drain terminal to form the diode-connected transistor. Meanwhile, keep-alive transistor M12 has a drain terminal coupled to the source terminal (node 108) of cascode transistor M9 and a source terminal coupled to the ground potential (node 104). The gate terminal of transistor M12 is connected to its own drain terminal to form the diode-connected transistor.

In the present embodiment, to complete the amplifier circuit, operational amplifier 100 further includes telescoped current sources formed by cascoded PMOS transistors M20 to M25. Specifically, three cascoded PMOS transistors M20-M22 are coupled between the negative output (Vo−) terminal 110 and the positive power supply voltage terminal 122 and three cascoded PMOS transistors M23-M25 are coupled between the positive output (Vo+) terminal 112 of operational amplifier 100 and the positive power supply voltage terminal 122. The power supply voltage Vdd is provided on the positive power supply voltage terminal 122. Transistors M20 and M23 are biased by a gate voltage Vb2, transistors M21 and M24 are biased by a gate voltage Vb3, and transistors M22 and M25 are biased by a gate voltage Vb4.

Operational amplifier 100 also includes active feedback amplifiers coupled to the positive and the negative output sides of the operational amplifier. On the negative output side, NMOS transistor M3 and PMOS transistors M26 and M27 form the active feedback amplifier for the cascode transistor M8. The gate terminal of transistor M3 is connected to the source terminal (node 106) of cascode transistor M8 while the gate terminal of cascode transistor M8 is connected to the drain terminal (node 124) of transistor M3. The source terminal of transistor M3 is connected to the ground potential. PMOS transistors M26 and M27, biased by gate voltage Vb3 and Vb4 respectively, are coupled to the drain terminal (node 124) of transistor M3. As thus configured, transistors M3, M26 and M27 form an active feedback amplifier for cascode transistor M8.

On the positive output side, NMOS transistor M4 and PMOS transistors M28 and M29 form the active feedback amplifier for the cascode transistor M9. The gate terminal of transistor M4 is connected to the source terminal (node 108) of cascode transistor M9 while the gate terminal of cascode transistor M9 is connected to the drain terminal (node 126) of transistor M4. The source terminal of transistor M4 is connected to the ground potential. PMOS transistors M28 and M29, biased by gate voltage Vb3 and Vb4 respectively, are coupled to the drain terminal (node 126) of transistor M4. As thus configured, transistors M4, M28 and M29 form an active feedback amplifier for cascode transistor M9. The active feedback amplifiers formed by transistors M3, M4 and M26 to M29 work to increase the operational amplifier's total voltage gain by multiplying the transconductance of the output stage.

Keep-alive transistors M11 and M12 of operational amplifier 100 implement the keep-alive cascode biasing technique in accordance with the present invention. The keep-alive transistors operate to feed forward a fraction of the tail current to the source terminals of the cascode transistors to keep the cascode transistors turned on (or alive) during a transient overload event. In particular, by using diode-connected keep-alive transistors M11 and M12, the feed forward current in operational amplifier 100 of the present invention is a variable fraction of the tail current. Therefore, diode-connected keep-alive transistors M11 and M12 can flow enough amount of current into the source terminals of cascode transistors M8 and M9 to keep the cascode transistors alive in response to any transient overload event. The amount of current being supplied by diode-connected transistors M11 and M12 depends on the degree to which transistors M1 to M4 are overloaded. An increased amount of current supplied by keep-alive transistors M11 and M12 during certain overload conditions can enhance the settling time. Thus, the operational amplifier in accordance with the present invention can achieve a very fast settling time which fast settling time result is not achievable by the conventional operation amplifier circuits.

The current flowing through the keep-alive transistor M11 or M12 is given by the following equation:

$$I_{KA} = K_n/2*(Vgs-Vtn)^2,$$

where $K_n$ is a transistor parameter term given as $\mu_n C_{ox}(W/L)$, where $\mu_n$ is the mobility of the transistor, $C_{ox}$ is the capacitance of the gate oxide of the transistor and W/L is the width over length ratio of the transistor. Furthermore, voltage Vgs is the gate-to-source voltage of transistor M11 or M12 and Vtn is the threshold voltage of transistor M11 or M12.

Figure 1:
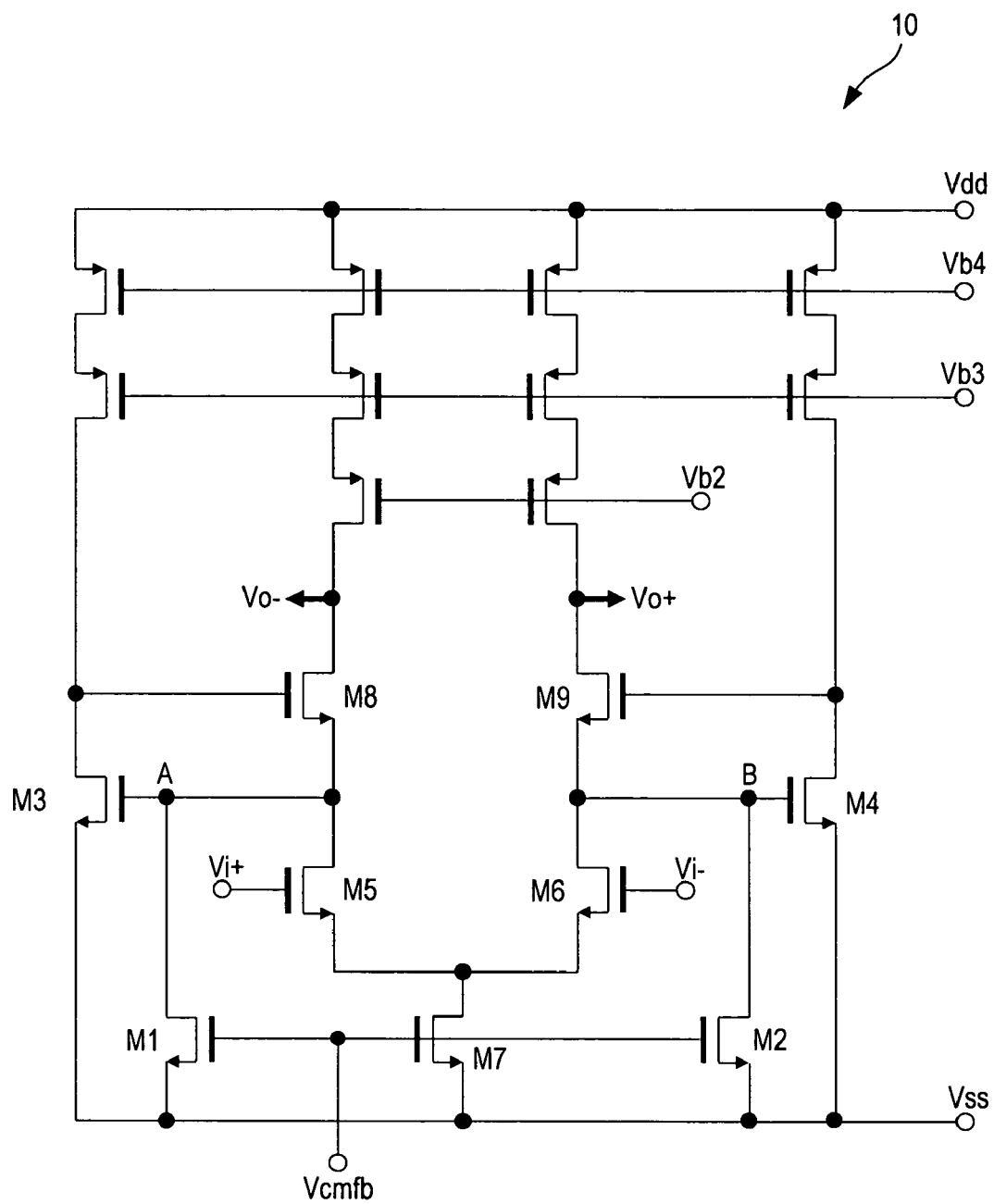
FIG. 1, which duplicates substantially FIG. 12 of the '607 patent, is a circuit diagram of a prior art folded cascode operational amplifier.

In view of the above equation, when the keep-alive transistors are biased by a fixed gate voltage, such as the common mode feed back voltage Vcmfb used in the prior art operational amplifier of FIG. 1, the keep-alive transistors can only flow a fixed amount of current, the fixed amount of current being a fixed fraction of the tail current flowing through tail current transistor M7. The fixed amount of current being flowed in the keep-alive transistors limits the ability of the keep-alive transistors to keep the cascode transistors alive over all transient overload conditions.

On the other hand, the keep-alive transistors M11 and M12 are diode-connected in accordance with the present invention. By diode-connecting transistors M11 and M12, the gate-to-source voltage Vgs of transistors M11 and M12 is the respective voltage $V_A$ or $V_B$ at node 106 or 108. Thus, the current conducted by transistors M11 and M12 will vary with the gate-to-source voltages (voltages $V_A$ and $V_B$) applied to the transistors. Voltages $V_A$ and $V_B$ will have a voltage value depending on the transient overload conditions. When there is an increased overloading, voltages $V_A$ and $V_B$ will increase and the current conducted by keep-alive transistors M11 and M12 will increase accordingly. By using a variable feed forward current to supply the cascode transistors M8 and M9, operational amplifier 100 of the present invention can achieve a fast settling time over all transient overload conditions.

Figure 3:
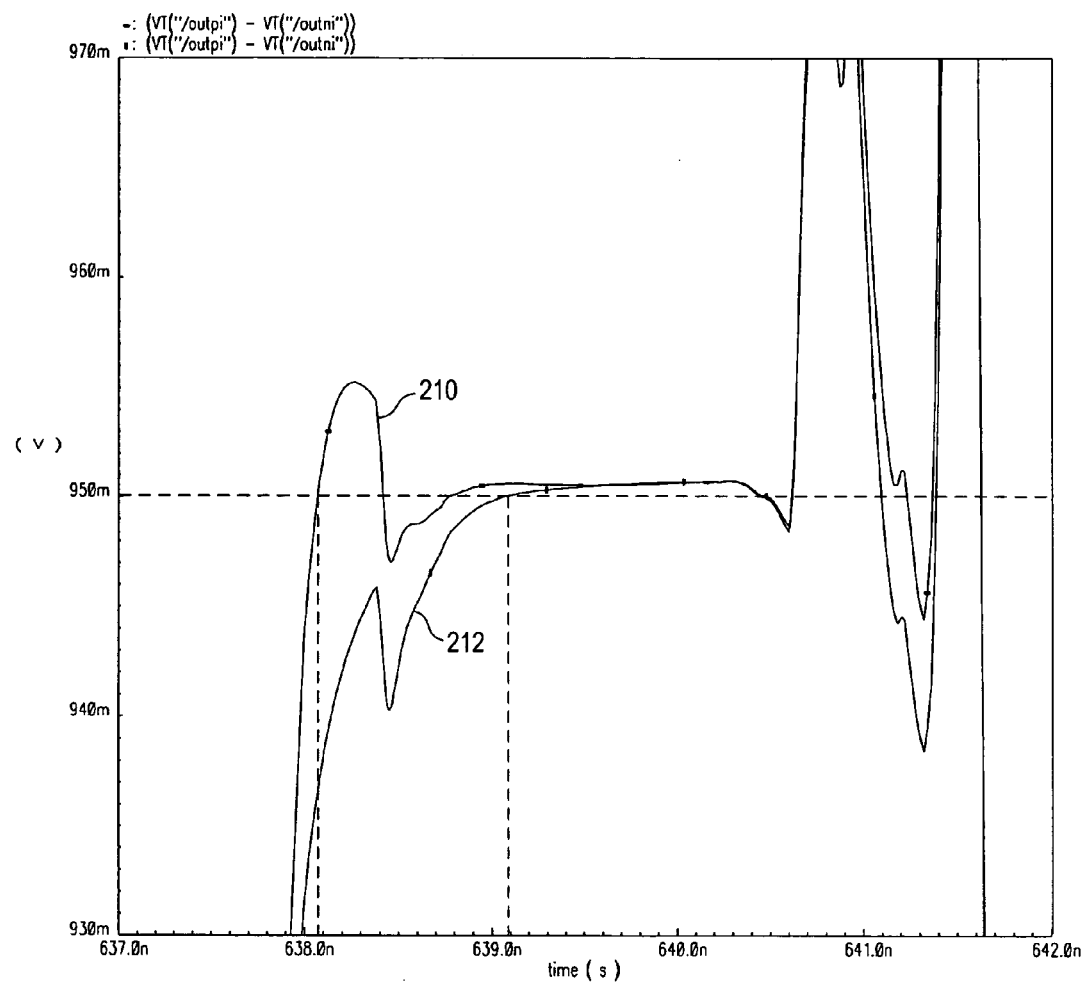
FIG. 3 includes simulation waveforms of the prior art operational amplifier of FIG. 1 and the operational amplifier in accordance with the present invention of FIG. 2.

FIG. 3 includes simulation waveforms of the prior art operational amplifier of FIG. 1 and the operational amplifier in accordance with the present invention of FIG. 2. Referring to FIG. 3, curve 210 is the transient response (voltage vs. time) for the output signals of operational amplifier 100 of FIG. 2 while curve 212 is the transient response for the output signals of prior art operational amplifier 10 of FIG. 1. As can be observed from the simulation waveforms, curve 210 reaches 950 mV at a time of about 638.1 ns while curve 212 reaches 950 mV at a time of about 639.1 ns. Thus, the operation amplifier of the present invention provides at least a 1 ns improvement of settling time over the prior art operational amplifier. Note that in the simulation waveforms of FIG. 3, curves 210 and 212 exhibit voltage dipping characteristics. Such voltage dipping characteristics are merely results of the simulation and are attributable to circuit elements in the circuit model being used to generate the simulation result. The voltage dipping characteristics shown in FIG. 3 are not indicative of the actual behavior and performance of the operation amplifier of the present invention.

The above detailed descriptions are provided to illustrate specific embodiments of the present invention and are not intended to be limiting. Numerous modifications and variations within the scope of the present invention are possible. The present invention is defined by the appended claims.

I claim:

1. An operational amplifier comprising:
   a pair of differential input transistors, each transistor having a source terminal, a gate terminal and a drain terminal, the pair of differential input transistors being connected together at the source terminals, the gate terminals of the pair of differential input transistors receiving a pair of differential input signals;
   a pair of cascode transistors, each cascode transistor having a source terminal, a gate terminal and a drain terminal, each cascode transistor being connected to the respective input transistor so as to form a cascode, the drain terminals of the pair of cascode transistors providing a pair of differential output signals; and
   a keep-alive circuit connected to provide first and second bias currents to the source terminals of the pair of cascode transistors and a third bias current to the source terminals of the pair of differential input transistors, the keep-alive circuit comprising:
      a tail current transistor having a source terminal connected to a ground potential, a drain terminal connected to the source terminals of the pair of differential input transistors, and a gate terminal receiving a first bias voltage the tail current transistor conducting the third bias current; and
      a pair of keep-alive transistors, a first keep-alive transistor having a source terminal connected to the ground potential, a gate terminal and a drain terminal connected together and to the source terminal of a first cascode transistor of the pair of cascode transistors to provide the first bias current, and a second keep-alive transistor having a source terminal connected to the ground potential, a gate terminal and a drain terminal connected together and to the source terminal of a second cascode transistor of the pair of cascode transistors to provide the second bias current, wherein each of the first and second bias currents is a variable current being a function of a voltage at the source terminal of the respective cascode transistor and is a variable fraction of the third bias current conducted by the tail current transistor.

2. The operational amplifier of claim 1, further comprising:
a pair of amplifiers operatively connected to provide active feedback to the pair of cascode transistors.

3. The operational amplifier of claim 2, wherein the pair of amplifiers comprise:
a first amplifier comprising a first amplifier transistor having a gate terminal coupled to the source terminal of a first cascode transistor of the pair of cascode transistors, a drain terminal coupled to the gate terminal of the first cascode transistor and a source terminal coupled to a ground potential; and
a second amplifier comprising a second amplifier transistor having a gate terminal coupled to the source terminal of the second cascode transistor of the pair of cascode transistors, a drain terminal coupled to the gate terminal of the second cascode transistor and a source terminal coupled to the ground potential.

4. The operational amplifier of claim 1, further comprising:
a pair of current sources operatively connected to the pair of cascode transistors to bias the operational amplifier.

5. The operational amplifier of claim 4, wherein each one of the pair of current sources comprises a plurality of cascoded transistors.

6. An operational amplifier comprising:
a first input transistor having a source terminal, a gate terminal and a drain terminal, the gate terminal receiving a first input signal of a pair of differential input signals;
a second input transistor having a source terminal, a gate terminal and a drain terminal, the source terminal of the second input transistor being connected to the source terminal of the first input transistor, the gate terminal receiving a second input signal of the pair of differential input signals;
a first cascode transistor having a source terminal, a gate terminal and a drain terminal, the source terminal being connected to the drain terminal of the first input transistor and the drain terminal providing a first output signal of a pair of differential output signals;
a second cascode transistor having a source terminal, a gate terminal and a drain terminal, the source terminal being connected to the drain terminal of the second input transistor and the drain terminal providing a second output signal of the pair of differential output signals;
a tail current transistor having a drain terminal connected to the source terminals of the first and second input transistors, a source terminal connected to a ground potential and a gate terminal coupled to a first bias voltage, the tail current transistor conducting a first bias current;
a first keep-alive transistor having a source terminal being connected to the ground potential, a gate terminal and a drain terminal connected together and to the source terminal of the first cascode transistor, the first keep-alive transistor conducting a second bias current; and
a second keep-alive transistor having a source terminal being connected to the ground potential, a gate terminal and a drain terminal connected together and to the source terminal of the second cascode transistor, the second keep-alive transistor conducting a third bias current,
wherein the second bias current is a function of a voltage at the source terminal of the first cascode transistor and the third bias current is a function of a voltage at the source terminal of the second cascode transistor, the second bias current and the third bias current each being a variable fraction of the first bias current conducted by the tail current transistor.

7. The operational amplifier of claim 6, wherein the second bias current conducted by the first keep-alive transistor and the third bias current conducted by the second keep-alive transistor increase as the voltage at the source terminals of the respective first and second cascode transistors increase, thereby reducing the settling time of the operation amplifier during a transient overload event.

8. The operational amplifier of claim 6, further comprising:
a first amplifier operatively connected to provide active feedback to the first cascode transistor; and
a second amplifier operatively connected to provide active feedback to the second cascode transistor.

9. The operational amplifier of claim 8, wherein:
the first amplifier comprises a first amplifier transistor having a gate terminal coupled to the source terminal of the first cascode transistor, a drain terminal coupled to the gate terminal of the first cascode transistor and a source terminal coupled to the ground potential; and
the second amplifier comprises a second amplifier transistor having a gate terminal coupled to the source terminal of the second cascode transistor, a drain terminal coupled to the gate terminal of the second cascode transistor and a source terminal coupled to the ground potential.

10. The operational amplifier of claim 9, wherein:
the first amplifier further comprises a first amplifier current source coupled to the drain terminal of the first amplifier transistor, the first amplifier current source comprising a plurality of cascoded transistors; and
the second amplifier further comprises a second amplifier current source coupled to the drain terminal of the second amplifier transistor, the second amplifier current source comprising a plurality of cascoded transistors.

11. The operational amplifier of claim 6, further comprising:
a first current source operatively connected to the drain terminal of the first cascode transistor to bias the operational amplifier; and
a second current source operatively connected to the drain terminal of the second cascode transistor to bias the operational amplifier.

12. The operational amplifier of claim 11, wherein each one of the first and second current sources comprises a plurality of cascoded transistors.

13. The operational amplifier of claim 12, wherein the first and second input transistors, the first and second cascode transistors, the tail current transistor and the first and second keep-alive transistors comprise NMOS transistors and the first and second current sources each comprises a plurality of PMOS cascoded transistors.

* * * * *

UNITED STATES PATENT AND TRADEMARK OFFICE
CERTIFICATE OF CORRECTION

| | | |
|---|---|---|
| PATENT NO. | : 7,265,621 B1 | Page 1 of 1 |
| APPLICATION NO. | : 11/181564 | |
| DATED | : September 4, 2007 | |
| INVENTOR(S) | : Byung-Moo Min | |

It is certified that error appears in the above-identified patent and that said Letters Patent is hereby corrected as shown below:

Column 6, line 54, claim 1: Cancel "voltage the" and substitute --voltage, the--.

Signed and Sealed this

Second Day of September, 2008

JON W. DUDAS
*Director of the United States Patent and Trademark Office*